(12) United States Patent
Ho (10) Patent No.: US 11,835,574 B2
(45) Date of Patent: Dec. 5, 2023

(54) SEMICONDUCTOR TESTING APPARATUS FOR WAFER PROBING TESTING AND FINAL PACKAGED IC TESTING

(71) Applicant: TEST21 TAIWAN CORPORATION, Hsinchu (TW)

(72) Inventor: Shun-Bon Ho, Hsinchu (TW)

(73) Assignee: TEST21 TAIWAN CORPORATION, Hsinchu (TW)

( * ) Notice: Subject to any disclaimer, the term of this patent is extended or adjusted under 35 U.S.C. 154(b) by 71 days.

(21) Appl. No.: 17/692,138

(22) Filed: Mar. 10, 2022

(65) Prior Publication Data

US 2022/0291279 A1 Sep. 15, 2022

(30) Foreign Application Priority Data

Mar. 10, 2021 (TW) .................................. 110108580

(51) Int. Cl.
*G01R 31/10* (2006.01)
*G01R 31/28* (2006.01)
*G01K 1/14* (2021.01)

(52) U.S. Cl.
CPC ........... *G01R 31/2862* (2013.01); *G01K 1/14* (2013.01); *G01R 31/2863* (2013.01)

(58) Field of Classification Search
CPC ............ G01R 31/2862; G01R 31/2863; G01R 31/2865; G01R 31/2868; G01R 31/2874; G01R 31/2875; G01R 31/2877
See application file for complete search history.

(56) References Cited

U.S. PATENT DOCUMENTS

| 6,362,640 B1* | 3/2002 | Wee ................. G01R 31/31905 |
| | | 324/750.08 |
| 2005/0206368 A1* | 9/2005 | Lopez ................ G01R 31/2891 |
| | | 374/E1.021 |
| 2008/0116925 A1* | 5/2008 | Sunohara .......... G01R 31/2875 |
| | | 374/142 |
| 2010/0289514 A1* | 11/2010 | Washio .................. G01R 31/54 |
| | | 324/750.05 |
| 2017/0363680 A1* | 12/2017 | Saito .................. G01R 31/2874 |
| 2018/0136276 A1* | 5/2018 | Shimizu .................... G01K 1/00 |
| 2019/0207351 A1* | 7/2019 | Morinari ............ G01R 31/2875 |
| 2020/0371156 A1* | 11/2020 | Yamasaki .......... G01R 31/2875 |

FOREIGN PATENT DOCUMENTS

| JP | H0424459 | * | 6/1992 |
| JP | 2002196017 | * | 7/2002 |
| JP | 2006173206 | * | 6/2006 |

\* cited by examiner

*Primary Examiner* — Thang X Le (57) ABSTRACT

During the semiconductor testing process, in order to decrease a temperature difference between a predetermined temperature and a measured temperature, the present disclosure provides a wafer probing testing apparatus and a final testing apparatus for semiconductor testing. The wafer probing testing apparatus comprises a printed circuit board, a probe head, a heater, a thermal sensor and a thermal controller. The final testing apparatus comprises a printed circuit board, a socket, a heater, a thermal sensor and a thermal controller. Due to the arrangement of the thermal sensor, the heater and the thermal controller, the temperature difference of the predetermined temperature may be decreased, and the cost during the semiconductor testing can also be reduced.

9 Claims, 5 Drawing Sheets

SEMICONDUCTOR TESTING APPARATUS FOR WAFER PROBING TESTING AND FINAL PACKAGED IC TESTING

CROSS-REFERENCE TO RELATED APPLICATION

This application claims the priority from TW Patent Application No. 110108580, filed on Mar. 10, 2021, and the full disclosure of which is incorporated herein by reference.

BACKGROUND

1. Field of the Invention

The present disclosure is related to a semiconductor testing apparatus, in particular to a semiconductor testing apparatus which can be used to control a temperature of a printed circuit board or a socket during wafer probing testing or the final testing of a packaged integrated circuit respectively.

2. Description of the Related Art

In the wafer probing testing and the final testing, wafers and integrated circuit (IC) packages are often tested under three different temperature conditions (tri-temp testing).

In conventional high-temperature wafer probing testing, a heated wafer chuck is not only used as a heat source and a linear motion platform, but is also responsible for wafer positioning, probe alignment and periodic probe cleaning. However, this manner of heating the wafer can result in indirect heating of the entire probe head assembly, which comprises a probe head, a substrate and a printed circuit board (probe head PCB). Ideally, the wafer probing should only begin when all of the preceding elements have reached thermal equilibrium at a predetermined temperature. However, during an initial phase of the wafer probing, the entire probe head assembly will be heated typically start at room temperature and will be heated up slowly as the test progresses.

Moreover, during wafer loading and probe cleaning operations, the temperature of the wafer may fall rapidly when the probe head assembly is separated from the heat source. Thermal changes of the testing apparatus may affect the accuracy of the probe alignment and the long-term reliability of the apparatus. Electrically speaking, the resistive, inductive and capacitive properties of elements of the testing apparatus may vary under different temperatures; resulting in unreliable and inaccurate test results and ultimately impairing judgment of integrated circuit validity.

During final testing, a packaged integrated circuit (IC) is conventionally preheated by a heat source within a robotic handler before performing parametric tests with an automatic test equipment (ATE). As soon as the packaged integrated circuit (IC) is moved away from the heat source and is placed in a test socket, the packaged integrated circuit (IC) begins to cool down over the duration of test, as there is a temperature gradient exists between the robotic handler and the test socket. That is, the temperature of the packaged integrated circuit (IC) is not in a steady state. Consequently, as was the case for the previously mentioned wafer probing test, the uncertain testing temperature of the packaged integrated circuit also result in unreliable and inaccurate test results collection and ultimately impairing judgment of packaged integrated circuit validity. Because of this temperature instability problem during integrated circuit testing, temperature control in semiconductor testing apparatus is becoming critical in high-temperature testing of semiconductors, especially for automotive-grade application integrated circuits that may require sustained high-temperature operation.

In order to effectively compensated for temperature difference between testing apparatus and packaged integrated circuit during wafer probing and final testing, an effective solution is needed to stabilize temperature of components of a semiconductor testing apparatus, tightening of temperature tolerance during high temperature semiconductor validation.

SUMMARY

To solve the above problems, embodiments of the present disclosure describe semiconductor testing apparatus with temperature control. The temperature controlled semiconductor testing apparatus may be applied to semiconductor testing operations such as wafer probing testing and final testing of packaged IC. The semiconductor testing apparatus comprises a heater, a thermal sensor, and a thermal controller. The heater, the thermal sensor and the thermal controller of the semiconductor testing apparatus are connected to a printed circuit board. Temperatures of the substrate and/or the printed circuit board are monitored through the thermal sensor by the thermal controller. As a result, the substrate and/or the printed circuit board are better maintained at a predetermined temperature by the heater. Accordingly, a probe head is disposed adjacent to the substrate and can maintain a relatively good thermal stability due to a stable heat source (i.e. heater) in proximity, and can help provide the collection of reliable and accurate test data.

Specifically, an embodiment of the present disclosure provides a semiconductor testing apparatus, which includes a printed circuit board, a probe head, a substrate, a heater, a thermal sensor and a thermal controller. The probe head is disposed on the printed circuit board, and forms a substrate space with the printed circuit board. The probe head has a plurality of probes penetrating through the probe head. The substrate is disposed in the substrate space, and is electrically connected to the printed circuit board.

Also, the substrate is electrically connected to a probe. The thermal sensor is connected to the substrate to detect a temperature of the substrate. The thermal controller is electrically connected to the heater and the thermal sensor to adjust a thermal condition of the heater. In use, the probes are electrically connected to the substrate and to a wafer, so that a predetermined temperature may be maintained for a long period. Consequently, accurate and reliable test data may be provided when performing wafer probing testing.

According to an embodiment of the present disclosure, the heater is disposed in the printed circuit board in a form of a printed circuit trace to heat the printed circuit board.

According to an embodiment of the present disclosure, the heater is disposed adjacent to an edge or a side of the printed circuit board.

According to an embodiment of the present disclosure, the thermal sensor is a negative temperature coefficient thermistor, a temperature sensor integrated circuit, a platinum stock sensor, a thermocouple, or a combination thereof.

According to an embodiment of the present disclosure, the temperature control device further comprises another thermal sensor. The other thermal sensor is disposed adjacent to an edge of the printed circuit board to detect a temperature of the printed circuit board.

According to an embodiment of the present disclosure, the other thermal sensor is a negative temperature coefficient thermistor, a temperature sensor integrated circuit, a platinum stock sensor, a thermocouple or a combination thereof.

According to an embodiment of the present disclosure, the thermal controller is disposed on the printed circuit board in a form of a printed circuit board.

According to an embodiment of the present disclosure, the thermal controller is disposed on the printed circuit board as an independent component.

According to an embodiment of the present disclosure, the thermal controller is disposed adjacent to an edge or a side of the printed circuit board.

According to an embodiment of the present disclosure, the thermal controller is a proportional-integral-derivative (PID) microcontroller, a watchdog circuit or a combination thereof.

According to an embodiment of the present disclosure, the thermal controller is adapted to be electrically connected to an automatic test equipment to receive temperature control signals and to transmit a temperature monitoring signal.

Based on the above disclosure, when used in the wafer probing testing, the semiconductor testing apparatus is applied to the functional testing of a wafer. The semiconductor testing apparatus for wafer probing testing comprises a printed circuit board, a probe head, a heater, a thermal sensor and a thermal controller. The printed circuit board has two pairs of opposite edges. The probe head is disposed on the printed circuit board and forms a substrate space to accommodate a substrate. The probe head has a probe. The probe penetrates the probe head, and the probe is adapted to electrically connect to the wafer. The heater is disposed on the printed circuit board to heat up the printed circuit board. The thermal sensor is disposed adjacent to an edge of the printed circuit board to detect a temperature of the printed circuit board. The thermal controller is electrically connected to the heater and the thermal sensor to decrease a temperature difference between a predetermined temperature and the temperature of the printed circuit.

In the semiconductor testing apparatus for final testing of packaged integrated circuits, the semiconductor testing apparatus is applied to functional testing of a packaged integrated circuit (IC). The semiconductor testing apparatus for final testing of packaged integrated circuits (ICs) comprises a printed circuit board, a socket, a heater, a thermal sensor and a thermal controller. The socket has two pairs of opposite inner sides, and is disposed on the printed circuit board to carry the packaged integrated circuit (IC). The heater is arranged as a loop within the socket. The thermal sensor is disposed at the inner side of the socket to detect a temperature of the socket. The thermal controller is electrically connected to the heater and the first thermal sensor to decrease a temperature difference between a predetermined temperature and the temperature of the socket.

In conclusion, the embodiments of the present disclosure can decrease temperature differences when testing semiconductors to reduce time related costs during wafer probing testing and during final testing of packaged integrated circuits. Also, the embodiments of the present disclosure allow the collection of semiconductor test data with higher accuracy and higher reliability. As well, damage and other problems with the test equipment may be avoided, which can further reduce the cost of testing. Further, the embodiments of the present disclosure can control the heater effectively without causing excessive heating, or the wastage of energy and its associated costs, therefore providing advantages for when performing wafer probing testing or final testing of packaged integrated circuits.

In order to further understand the technology, means and effects of the present disclosure, reference may be made to the following detailed description and drawings, so that the purpose, features and concepts of the present disclosure may be thoroughly and concretely understood. However, the following detailed description and drawings are only used to reference and illustrate the implementations of the present disclosure, and they are not intended to limit the present disclosure.

BRIEF DESCRIPTION OF THE DRAWINGS

The accompanying drawings are provided to enable persons with ordinary skills in the technical field of the present disclosure to further understand the present disclosure, and are incorporated into and constitute a part of the specification of the present disclosure. The drawings illustrate exemplary embodiments of the present disclosure, and are used to explain the principle of the present disclosure together with the description of the present disclosure.

DESCRIPTION OF THE PREFERRED EMBODIMENTS

The embodiments of the present disclosure are described in detail as reference, and the drawings of the present disclosure are illustrated. In the case of possibility, the reference numbers are used in the drawings to refer to the same or similar components. In addition, the embodiment is only one approach of the implementation of the design concept of the present disclosure, and the following embodiments are not intended to limit the present disclosure.

Various embodiments are described with reference to the attached drawings, where like reference numerals are used throughout the drawings to designate similar or equivalent elements. The drawings are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features may be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

In Semiconductor Testing

In view of the above-mentioned problems to be overcome, an embodiment of the present disclosure provides a semiconductor testing apparatus for wafer probing testing. In addition, a thermal sensor and a thermal controller are disposed adjacent to the printed circuit board. Thus, a temperature of the printed circuit board may be monitored by the thermal sensor, and a temperature response curve of the heater to the printed circuit board may be quickly controlled by the thermal controller, so that the printed circuit board may be better maintained at a predetermined temperature. Since the printed circuit board may be better maintained at the predetermined temperature, the test data is less likely to be affected by an inaccurate or unstable temperature, resulting in reliable validation of integrated circuit during prolonged and sustained high temperature testing.

Figure 1:
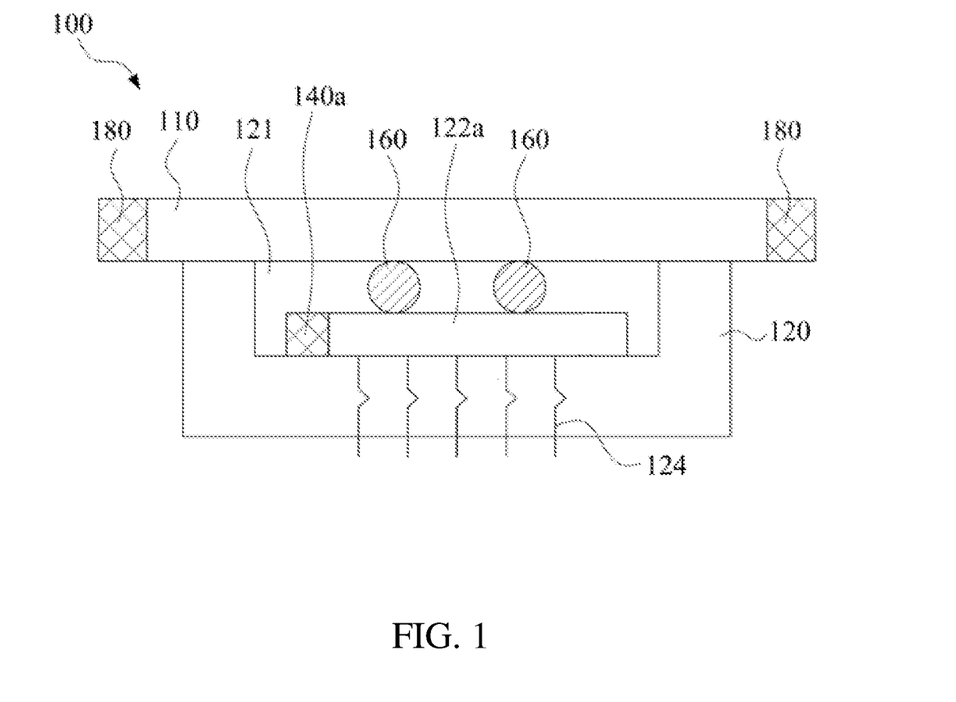
FIG. 1 is a schematic diagram of a semiconductor testing apparatus according to an embodiment of the present disclosure.

Referring to FIG. 1, FIG. 1 is a schematic diagram of a semiconductor testing apparatus according to an embodiment of the present disclosure. In FIG. 1, according to an embodiment of the present disclosure, a semiconductor testing apparatus 100 for semiconductor testing is provided. The semiconductor testing apparatus comprises a printed circuit board 110, a probe head 120, a substrate 122a, a heater 170 (the heater 170 is drawn in FIG. 3A and FIG. 3B), a thermal sensor 140a and a thermal controller 150a (the thermal controller 150a is drawn in FIG. 3A, and described later.)

The printed circuit board 110, the probe head 120 and the substrate 122a are further described as follows. The probe head 120 is disposed on the printed circuit board 110 and forms a substrate space 121 with the printed circuit board 110 to accommodate the substrate 122a. Specifically, the substrate space 121 is disposed on a side close to the probe head 120 to accommodate the substrate 122a. The probe head 120 has one or more probes 124. As well, the probes 124 penetrate the probe head 120, and the probes 124 are electrically connected to the substrate 122a and the device under test (for instance, a wafer 190 in FIG. 4, and the dice on the wafer 190 in FIG. 4 in a wafer probing, or a packaged integrated circuit (IC) in a final testing). Moreover, the probes 124 of the probe head 120 may be a cantilever, a vertical or a micro electro mechanism system (MEMS) type, but the present disclosure is not limited thereto. Hence, when executing the wafer probing test, the device under test and the printed circuit board 110 may be electrically connected to each other. Further, the semiconductor testing apparatus 100 is also act as a testing interface for semiconductor validation.

More specifically, the substrate 122a may be further electrically connected to the printed circuit board 110 through a plurality of solder balls 160. Moreover, the material of the solder balls 160 may be copper, copper alloy, lead-tin alloy or silver-tin alloy, and the present disclosure is not limited thereto. The shape of the solder balls 160 may be a spherical shape, a flat pad, a bump, or a column, and the present disclosure is not limited thereto.

Figure 2:
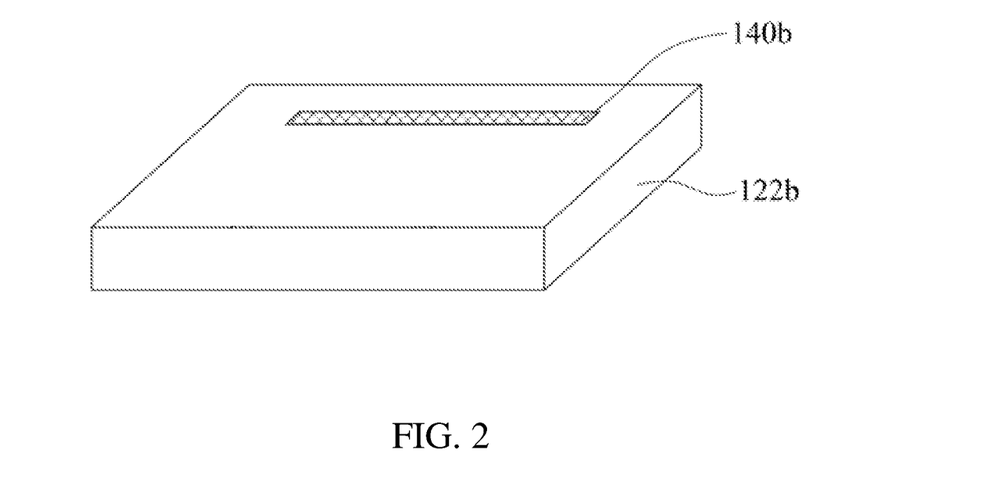
FIG. 2 is a schematic diagram of a thermal sensor disposed on a substrate according to an embodiment of the present disclosure.

According to another embodiment of the present disclosure, the thermal sensor may be arranged on the substrate in a different way, such as in FIG. 2. Referring to FIG. 2, FIG. 2 is a schematic diagram of a thermal sensor disposed on a substrate according to an embodiment of the present disclosure. In FIG. 2, a thermal sensor 140b may be disposed near an edge and on the upper surface of a substrate 122b, so that a temperature of the substrate can be detected by the thermal sensor 140b efficiently.

Figure 3A:
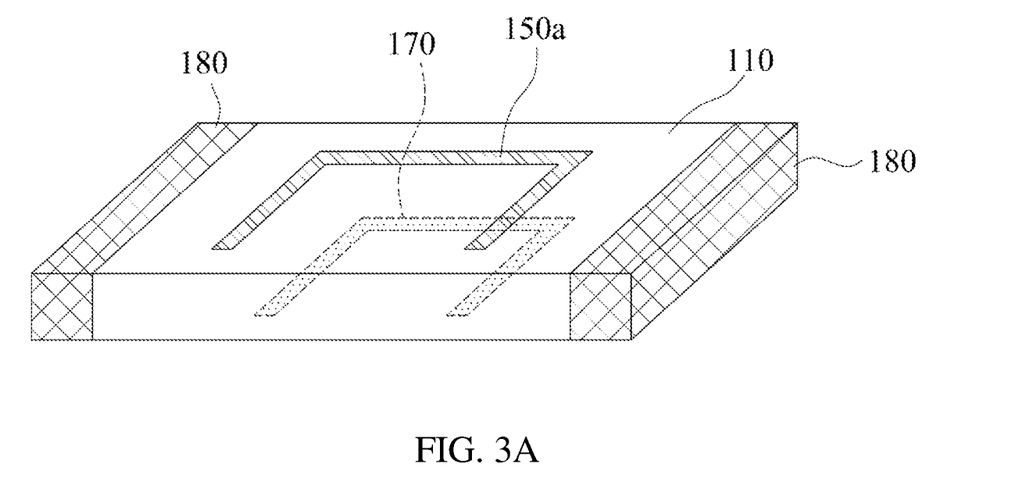
FIG. 3A is a schematic diagram of another heater, another thermal sensor and a thermal controller according to an embodiment of the present disclosure.

Next, according to another embodiment of the present disclosure, referring to FIG. 1 and FIG. 3A at the same time, FIG. 3A is a schematic diagram of another heater, another thermal sensor and a thermal controller according to an embodiment of the present disclosure, the semiconductor testing apparatus may further comprise one or more heaters 170. Furthermore, in FIG. 3A, according to an embodiment of the present disclosure, the heater 170 is disposed intricately in the printed circuit board 110 in the form of a printed circuit trace to heat the printed circuit board 110. Alternatively, according to an embodiment of the present disclosure, the heater 170 is disposed adjacent to one or more edges of the printed circuit board 110. Moreover, the heater 170 may be disposed on an upper side and/or a lower side of the printed circuit board 110, but the present disclosure is not limited thereto.

Further, the thermal sensor 140a is described as follow. Referring to FIG. 1, the thermal sensor 140a is thermally connected to the substrate 122a to detect the temperature of the substrate 122a. Specifically, the thermal sensor 140a may be a negative temperature coefficient thermistor, a temperature sensor integrated circuit (such as a LMT70 temperature sensor from Texas Instruments or a TMP117 high-precision digital circuit temperature sensor, etc.), a platinum stock sensor, a thermocouple or a combination thereof, but the present disclosure is not limited thereto.

In FIG. 1, according to an embodiment, the thermal sensor 140a is disposed adjacent to one or more edges of the substrate 122a. Alternatively, the thermal sensor 140a may be disposed on the upper side and/or the lower side of the substrate 122a, but the present disclosure is not limited thereto.

According to an embodiment of the present disclosure, referring to FIG. 2, a thermal sensor 140b is an independent component, and disposed on the upper side and/or the lower side of the substrate 122b. In this way, the thermal sensor 140b is thermally connected to the substrate 122a, so as to sense temperatures of the substrate 122a. The preceding independent component may be a negative temperature coefficient thermistor, a temperature sensor integrated circuit (such as a LMT70 temperature sensor from Texas Instruments or a TMP117 high-precision digital circuit temperature sensor, etc.), a platinum stock sensor, a thermocouple or a combination thereof, but the present disclosure is not limited thereto.

According to an embodiment of the present disclosure, besides the thermal sensor 140a of FIG. 1 and the thermal sensor 140b of FIG. 2, the semiconductor testing apparatus further comprises one or more thermal sensor 180. The thermal sensor 180 is thermally connected to the printed circuit board 110 to detect a temperature of the printed circuit board 110. For instance, in FIG. 1, the thermal sensor 180 may be disposed in the same manner as the thermal sensor 140a, so as to be disposed adjacent to one or more edges of the printed circuit board 110, or even on an upper side and/or a lower side of the printed circuit board 110, but the present disclosure is not limited thereto. Additionally, the thermal sensor 180 may be a negative temperature coefficient thermistor, a temperature sensor integrated circuit (such as a LMT70 temperature sensor from Texas Instruments or a TMP117 high-precision digital circuit temperature sensor, etc.), a platinum stock sensor, a thermocouple or a combination thereof, but the present disclosure is not limited thereto.

The thermal controller 150a is further described as follows. Referring to FIG. 3A, the thermal controller 150a is disposed on the printed circuit board 110 and electrically connected to the thermal sensor 140a of FIG. 1, (or the thermal sensor 140b of FIG. 2) to receive a temperature signal of the thermal sensors 140a and 140b. Therefore, the temperature of the substrate 122a in FIG. 1 (or the temperature of the substrate 122b in FIG. 2) may be obtained. Moreover, the thermal controller 150a may be disposed on the printed circuit board in a manner of a printed circuit trace, so as to utilize a remaining area on the printed circuit board 110 fully and effectively. As a result, a space of the printed circuit board 110 may be utilized effectively, and a volume of the whole device may be greatly reduced.

Figure 3B:
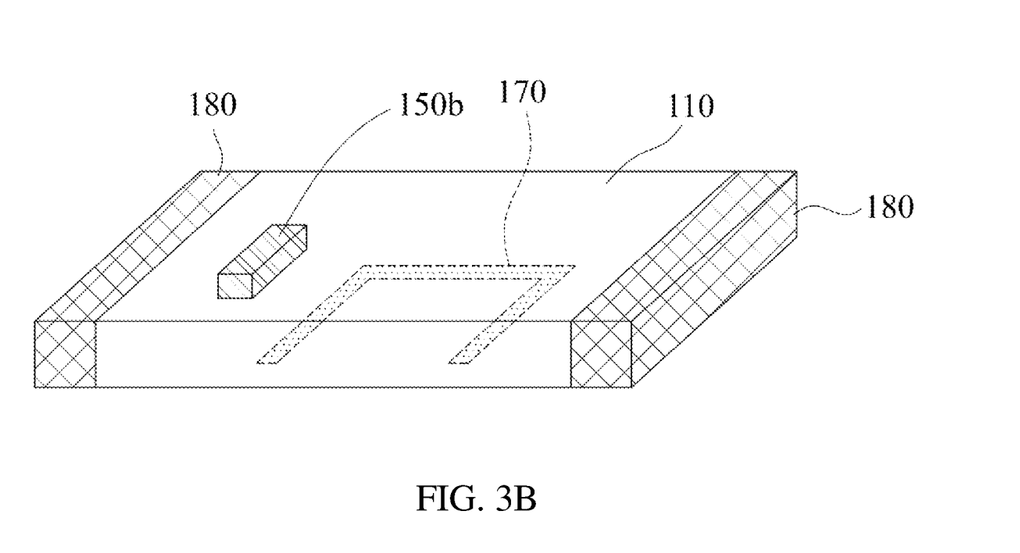
FIG. 3B is a schematic diagram of another heater, another thermal sensor and a thermal controller according to an embodiment of the present disclosure.

Further on, referring to FIG. 3B, FIG. 3B is a schematic diagram of another heater, another thermal sensor and a thermal controller according to an embodiment of the present disclosure. In FIG. 3B, according to an embodiment of the present disclosure, a thermal controller 150b is an independent component which is disposed on the printed circuit board 110. The preceding independent component is a proportional-integral-derivative microcontroller (PID microcontroller, that is, a microcontroller with an integrated circuit (IC), and a microcontroller with a PID logic program), a watchdog circuit or a combination thereof. The remaining contents are applicable to the above-mentioned contents of the thermal controller 150a, and it is not repeated here.

Similarly, according to an embodiment of the present disclosure, since the semiconductor testing apparatus 100 further comprises one or more heaters 170, the thermal controller 150a and 150b are electrically connected to the heater 170 to output the control signals to the heater 170. Hence, a heating condition of the heater 170 (for example, a heating PID program, a logic program, a temperature response curve, a heating rate, a heating time or a combination thereof) is adjusted, and the temperature of the printed circuit board 110 is further controlled.

According to an embodiment of the present disclosure, since the semiconductor testing apparatus 100 further comprises one or more thermal sensors 180, the thermal controllers 150a and 150b is electrically connected to the thermal sensor 180 to receive a temperature signal of the printed circuit board 110 from the thermal sensor 180. Besides, a manner in which the thermal controllers 150a and 150b are connected to the thermal sensor 180 is the same as the manner in which the thermal controllers 150a and 150b are connected to the thermal sensors 140a and 140b, as it is not repeated here.

According to an embodiment of the present disclosure, for a signal control between the thermal controllers 150a, 150b, and the thermal sensors 140a and 140b (or the thermal sensor 180), the thermal controllers 150a and 150b are electrically connected to an automatic test equipment (ATE) to according to instructions or poll the thermal sensors 140a and 140b (or the thermal sensor 180) continuously and periodically, and to receive the temperatures of the substrate 122a, 122b (or the printed circuit board 110) detected by the thermal sensors 140a, 140b (or the thermal sensor 180).

In Wafer Probing Testing

Based on the embodiments of the present disclosure of a semiconductor testing apparatus for wafer probing testing mentioned above, the temperature control device may be used in a wafer probing testing. The wafer probing testing should be carried out when all components are in thermal equilibrium, so it takes time to wait for all components to reach thermal equilibrium. Therefore, how to decrease a temperature difference of components with respect to a predetermined temperature is a main problem to be solved. Hence, an embodiment of the present disclosure provides a semiconductor testing apparatus for a wafer probing testing that can better control the temperature difference between a predetermined temperature and the temperature of the components of the semiconductor testing apparatus.

A heater and a temperature control device are disposed on a printed circuit board for the wafer probing to quickly control the temperature of the printed circuit board effectively. Additionally, the semiconductor testing apparatus for the wafer probing testing also has a thermal sensor and a thermal controller. In this way, the temperature of the printed circuit board may be monitored by the thermal sensor and controlled by the thermal controller, so as to make the printed circuit board not only better maintained at a predetermined temperature but also more accurately adjusted based on a temperature monitoring signal.

Figure 4:
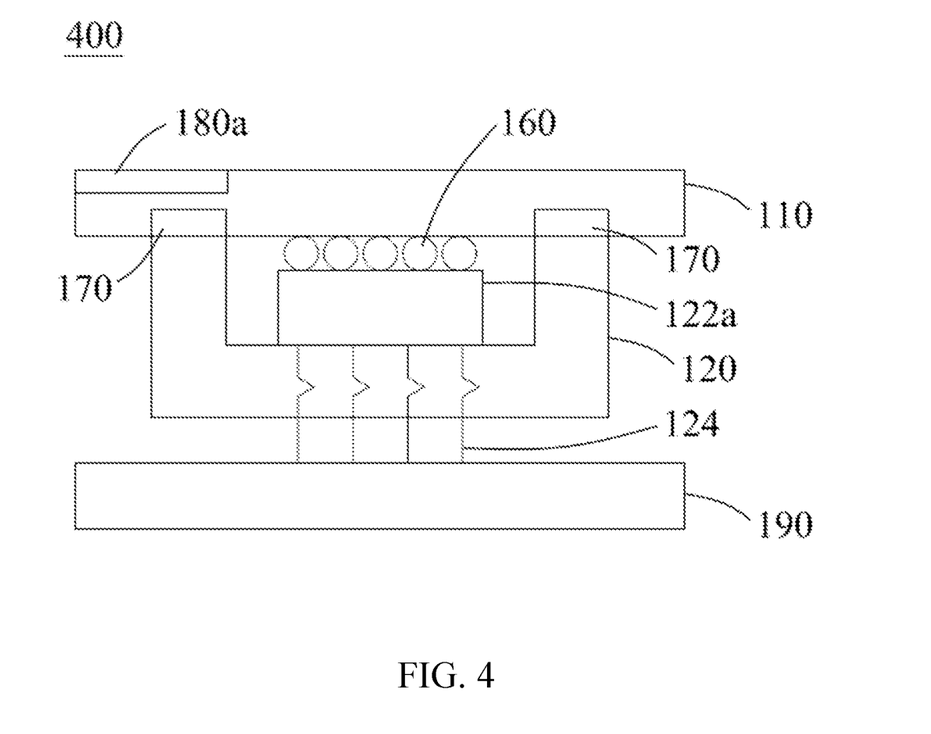
FIG. 4 is a schematic diagram of a testing device for wafer probing according to an embodiment of the present disclosure.

Referring to FIG. 4, FIG. 4 is a schematic diagram of a testing device for wafer probing according to an embodiment of the present disclosure. According to an embodiment of the present disclosure, in FIG. 4, the semiconductor testing apparatus 400 for the wafer probing tests is used for functional testing of a wafer 190. When the probe head 120 is electrically connected to a substrate 122a, and the substrate 122a is electrically connected to the wafer 190, a signal transmission between the wafer 190 and a printed circuit board 110 is detected at a predetermined temperature. In order to control and decrease a temperature difference between the predetermined temperature and the temperature of the printed circuit board 110, the thermal sensor 180a is disposed on an upper side of the printed circuit board 110, and the heater 170 is disposed on a lower side of the printed circuit board 110. Thus, the temperature of the printed circuit board 110 may be detected by the thermal sensor 180a and controlled by the thermal controller 150a or 150b disposed on the printed circuit board 110 (see FIGS. 3A-3B).

Furthermore, the thermal controller 150a or 150b may also be provided as an independent component to be electrically connected to the heater 170 and the thermal sensor 180a through a cable (not shown in FIG. 4). The independent component is disposed to be separated from the printed circuit board 110, so that excessive heat generated by the thermal controller may not negatively affect the wafer probing tests by altering the temperature of the printed circuit board 110.

According to an embodiment of the present disclosure, it may be understood that the substrate 122a in FIG. 4 may further comprise the thermal sensor 140b as shown in FIG. 2. Thus, the temperature of the substrate 122a in FIG. 4 also may be detected by the thermal sensor 140b.

According to another embodiment of the present disclosure, the semiconductor testing apparatus for the wafer probing tests may further comprise a second thermal sensor (not shown in FIG. 4). The second thermal sensor may be disposed adjacent to an edge of the printed circuit board 110 and disposed on a lower side of the printed circuit board 110. When both the thermal sensors are present, one temperature detected by the thermal sensor can also be monitored by the other thermal sensor. Therefore, as the amount of thermal data captured increased, the temperatures detected by the thermal sensors may be estimated more precisely.

As stated above, for the wafer probing tests, the semiconductor testing apparatus of the present disclosure has the following beneficial effects. Firstly, due to the arrangement of the heater, the embodiments of the present disclosure can provide a stable heat source for a long time to maintain the temperature of the printed circuit board. Also, the embodiments of the present disclosure can decrease the temperature difference between the predetermined operating temperature and the temperature of the printed circuit board. Therefore, even if the wafer probing tests are performed under high-temperature repeatedly for a long time, high-accuracy and high-reliability test data may be provided in the present disclosure.

Secondly, due to the arrangement of the thermal controller, the embodiments of the present disclosure can monitor and adjust the temperature of the printed circuit board rapidly and timely. Hence, in addition to adjusting the printed circuit board to a predetermined temperature, the embodiments of the present disclosure may also be used to prevent the temperature of the printed circuit board from being too high and affecting the reliability and accuracy of the semiconductor test data. Even more, the embodiments of the present disclosure can prevent other test equipment from being damaged due to the overly high temperature, and thus reduce the potential costs of replacing hardware devices or consumables during the wafer probing testing.

Thirdly, due to the arrangement of thermal controller, the embodiments of the present disclosure can adjust the temperature program or response curve of the heater timely through the thermal controller based on the temperature of the printed circuit board. Therefore, the embodiments of the present disclosure can effectively control the temperature of the printed circuit board causing over-heating and waste of energy costs as well, so as to reduce the cost of energy in the wafer probing test effectively.

In Final Testing of Packaged Integrated Circuits

Based on the embodiment of the present disclosure of a semiconductor testing apparatus for final testing of packaged integrated circuits mentioned above, the temperature control features of the apparatus may be used in final testing of packaged integrated circuits. Due to the relatively small size of packaged integrated circuits (ICs), as soon as the packaged integrated circuit (IC) is moved away from a heat source, the temperature of the packaged IC decreases rapidly. When the temperature of the packaged IC placed in a socket for testing is lower than a predetermined temperature, it is necessary to wait for the packaged IC to be heated to the predetermined temperature. Similarly, if the packaged IC has been preheated to a high temperature that exceeds the predetermined temperature when placed in the socket, it is necessary to wait for the packaged IC to cool down to the predetermined temperature. Consequently, whether the temperature of the packaged IC is lower or higher than the predetermined temperature when placed in a socket for testing, costly time is required to wait for the packaged IC to cool down or heat up as necessary.

Figure 5A:
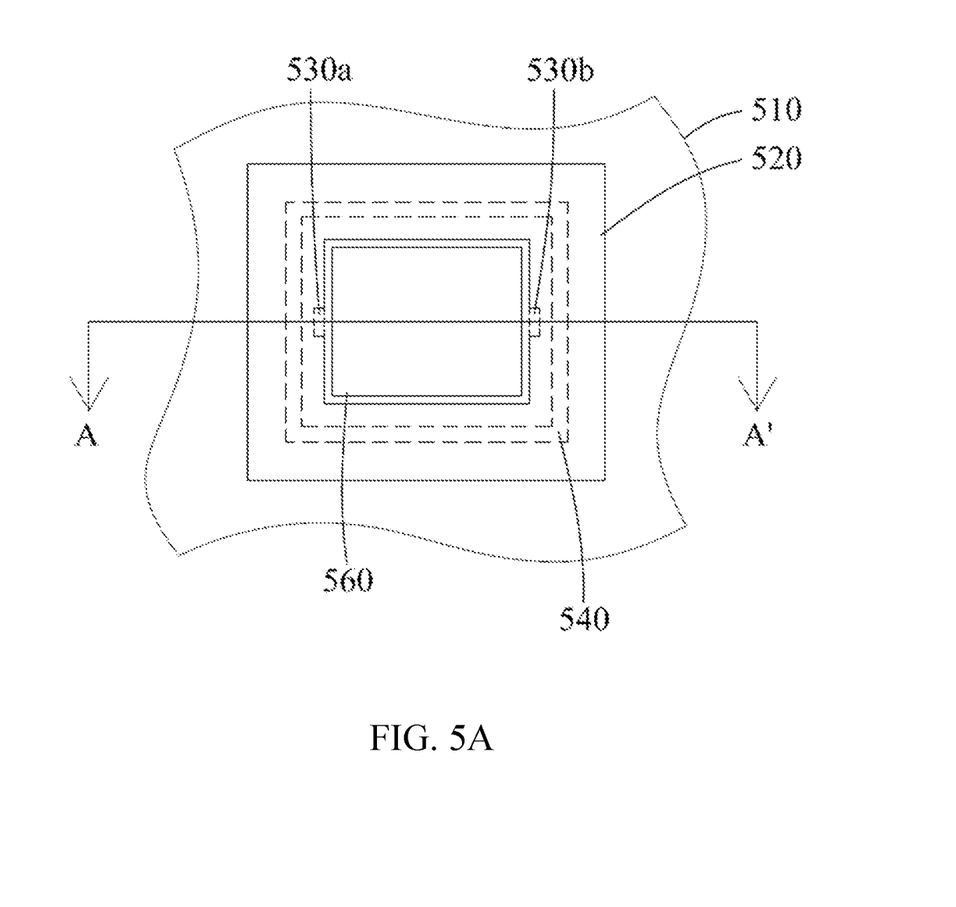
FIG. 5A is a top-view and perspective schematic diagram of a semiconductor testing apparatus used in a final testing according to an embodiment of the present disclosure.
Figure 5B:
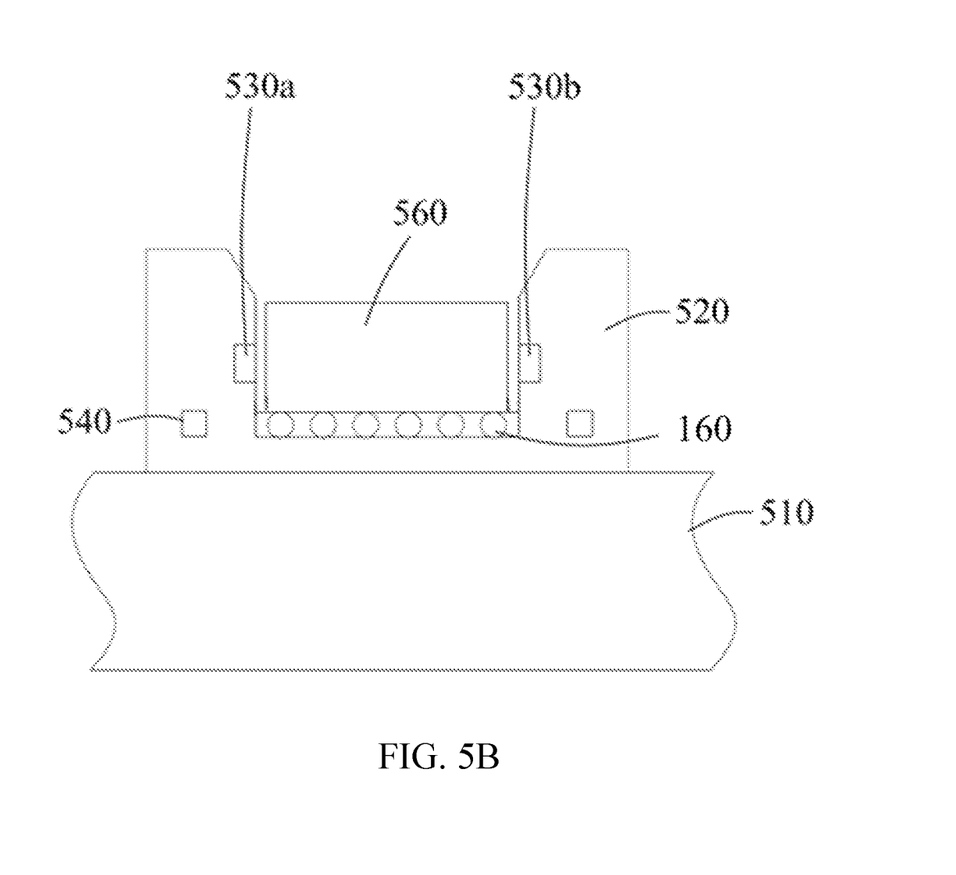
FIG. 5B is a schematic diagram of a semiconductor testing apparatus used in a final testing according to an embodiment of the present disclosure.

Referring to FIGS. 5A and 5B at the same time, FIG. 5A is a top-view and perspective schematic diagram of a semiconductor testing apparatus according to an embodiment of the present disclosure, and FIG. 5B is a schematic diagram of a semiconductor testing apparatus for final testing of packaged integrated circuits according to an embodiment of the present disclosure. When testing the functionality of a packaged integrated circuit 560, the semiconductor testing apparatus 500 for final testing of integrated circuits is configured to measure and control a temperature difference between components of the semiconductor testing apparatus and a predetermined temperature. Hence, the semiconductor testing apparatus 500 for final testing of packaged integrated circuits comprises a printed circuit board 510, a socket 520, a heater 540, a thermal sensor 530a and a thermal controller (such as the thermal controller 150a or 150b in FIGS. 3A-3B).

The socket 520 and the heater 540 are described as follow. The socket 520 has two pairs of opposite inner sides and is disposed on the printed circuit board 510 to carry the packaged integrated circuit (IC) 560. The heater 540 is arranged as a loop within the socket 520, as shown in FIG. 5A.

Further, referring to FIG. 5A, the thermal sensor 530a is disposed at the inner side of the socket to detect a temperature of the socket 520. As well, the first thermal sensor 530a is a contact thermal sensor or a contactless thermal sensor. It is worth mentioning that a measurement area of the contactless thermal sensor has an effective measurement area, so as to sense the temperature of the socket more precisely.

It may be understood that the semiconductor testing apparatus 500 for the final testing further comprises another thermal sensor 530b. Also, the thermal sensor 530b may be a contact thermal sensor or a contactless thermal sensor. The thermal sensor 530b is disposed at the inner side which opposite to the thermal sensor 530a of the socket to detect a temperature of the packaged integrated circuit 560.

The contact thermal sensors (530a and/or 530b) may be a negative temperature coefficient thermistor, a temperature sensor integrated circuit (such as a LMT70 temperature sensor from Texas Instruments or a TMP117 high-precision digital circuit temperature sensor, etc.), a platinum stock sensor, a thermocouple or a combination thereof. The contactless thermal sensors 530b may be an infrared thermal sensor or a far infrared thermal sensor. It is worth mentioning that a measurement area of the contactless thermal sensor has an effective measurement area, so as to sense the temperature of the packaged integrated circuit 560 more precisely.

Further on, the thermal controller is described as follow. According to an embodiment of the present disclosure, the thermal controller may be provided as an independent component to be electrically connected to the heater 540 through a cable (not shown in FIGS. 5A-5B). It is worth mentioning that the independent component is disposed to be separated from the printed circuit board 510, so that excessive heat generated by the thermal controller 150a or 150b may not negatively affect the results of the final testing of packaged integrated circuits.

As stated above, the semiconductor testing apparatus for final testing of packaged integrated circuits of the present disclosure has the following effects. Firstly, due to the arrangement of the heater inside the socket, the embodiments of the present disclosure can provide a stable heat source for a long time to maintain the temperature of the socket. Also, the embodiments of the present disclosure can decrease the temperature difference between the predetermined temperature and the temperature of the socket. Consequently, even during prolonged and sustained high-temperature test, highly reliable and accurate semiconductor test data over temperature may be obtained using the semiconductor testing apparatus for final testing of packaged integrated circuits of the present disclosure.

Secondly, due to the arrangement of the thermal controller, the embodiments of the present disclosure can monitor and adjust the temperature of the printed circuit board immediately and timely. Hence, in addition to maintaining the printed circuit board at a predetermined temperature, the embodiments of the present disclosure can also prevent the temperature of the printed circuit board from being too high and negatively affect the reliability and accuracy of the semiconductor test data. Even more, the embodiments of the present disclosure can prevent other test equipment from being damage due to the overly high temperature, as well as the associated costs of replacing hardware devices and consumables during the final testing. At the same time, the embodiments of the present disclosure may prolong the service life of the test machine and instruments. Moreover, the embodiments of the present disclosure indeed overcome some of the thermal instability problem of conventional printed circuit boards where temperature remains at a passive and unknown state for the duration of operation. Thirdly, due to the arrangement of thermal controller, the embodiments of the present disclosure can adjust a temperature program or a response curve of the heater over time through the thermal controller based on the measured temperature of the printed circuit board. Therefore, the embodiments of the present disclosure can effectively better control the temperature of the printed circuit board and avoid problems caused by over-heating, reduce waste of energy, and reduce associated costs while improving the testing efficiency.

Fourthly, due to the use of a feedback mechanism, the temperature difference between the temperature of the socket and the predetermined temperature may be decreased. As a result, the time to wait for the packaged IC to reach the predetermined temperature is reduced, which can further reduce the testing time and associated cost, so as to achieve higher efficiency in the final testing of packaged integrated circuits.

It should be understood that the examples and embodiments described herein are for illustrative purpose only, and various modification or change in view of them will be suggested to those skilled in the art, and will be included in the spirit and scope of this application and the appendix within the scope of the claims.

What is claimed is:

1. A wafer probing apparatus for detecting a function of a wafer, the wafer probing apparatus comprising:
   a printed circuit board;
   a probe head disposed on the printed circuit board and forming a substrate space to accommodate a substrate, wherein the probe head has a probe penetrating the probe head, and the probe is adapted to electrically connect to the wafer;
   a substrate, located within the substrate space formed by the probe head, wherein the probe penetrating the probe head is electrically connected to the substrate, and the substrate is electrically connected to the printed circuit board through a plurality of solder balls;
   a heater in the form of a printed circuit trace of the printed circuit board to heat the printed circuit board;
   a first thermal sensor disposed on the printed circuit board to detect a temperature of the printed circuit board; and
   a thermal controller electrically connected to the heater and the first thermal sensor to decrease a temperature difference between a predetermined temperature and the temperature of the printed circuit board.

2. The wafer probing apparatus of claim 1, wherein the first thermal sensor is a negative temperature coefficient thermistor, a temperature sensor integrated circuit, a platinum stock sensor, a thermocouple or a combination thereof.

3. The wafer probing apparatus of claim 1, further comprising a second thermal sensor electrically connected to the thermal controller, wherein the second thermal sensor and the first thermal sensor are respectively disposed on opposite surfaces and opposite edges of the printed circuit board.

4. The wafer probing apparatus of claim 3, wherein the second thermal sensor is a negative temperature coefficient thermistor, a temperature sensor integrated circuit, a platinum stock sensor or a thermocouple.

5. The wafer probing apparatus of claim 1, wherein the thermal controller is provided on the printed circuit board as an independent component.

6. The wafer probing apparatus of claim 1, wherein the thermal controller is provided as an independent component to be electrically connected to the heater and the thermal sensor through a cable.

7. The wafer probing apparatus of claim 1, wherein the thermal controller is a proportion integration microcontroller, a watchdog circuit or a combination thereof.

8. The wafer probing apparatus of claim 1, wherein the thermal controller is adapted to be electrically connected to an automatic test equipment to input and out a temperature signal.

9. The wafer probing apparatus of claim 1, further comprising a substrate thermal sensor on the substrate to detect a temperature of the substrate.

* * * * *